United States Patent [19]
Yoshifuji

[11] Patent Number: 5,289,340
[45] Date of Patent: Feb. 22, 1994

[54] STRUCTURE OF AN ELECTRONIC DEVICE INCLUDING A NUMBER OF PRINTED CIRCUIT BOARDS

[75] Inventor: Yuuki Yoshifuji, Tokyo, Japan

[73] Assignee: NEC Corporation, Tokyo, Japan

[21] Appl. No.: 903,669

[22] Filed: Jun. 24, 1992

[30] Foreign Application Priority Data

Jun. 25, 1991 [JP] Japan .................. 3-153548

[51] Int. Cl.$^5$ .............................................. H05K 7/20
[52] U.S. Cl. ...................... 361/695; 439/61; 361/785; 361/805
[58] Field of Search ............. 307/112, 113; 200/292; 211/41; 439/61, 62, 65, 74, 76, 485; 174/16.1; 165/80.3; 361/383, 384, 343, 394, 395, 412, 413, 415, 416

[56] References Cited

U.S. PATENT DOCUMENTS

| | | | |
|---|---|---|---|
| 3,725,744 | 4/1973 | Reed | 361/416 |
| 4,472,765 | 9/1984 | Hughes . | |
| 4,708,660 | 11/1987 | Claeys | 439/65 |
| 4,876,630 | 10/1989 | Dara | 361/416 |
| 4,906,987 | 3/1990 | Venaleck | 340/825.83 |
| 4,949,171 | 8/1990 | Grandmougin | 361/416 |
| 4,969,066 | 11/1990 | Eibl | 361/413 |
| 5,111,200 | 5/1992 | Jasmer | 340/826 |
| 5,121,290 | 6/1992 | Azar | 361/384 |
| 5,122,691 | 6/1992 | Balakrishnan | 361/413 |
| 5,124,638 | 6/1992 | Winroth | 361/416 |
| 5,136,464 | 8/1992 | Ohmori | 361/384 |

*Primary Examiner*—Gerald P. Tolin
*Attorney, Agent, or Firm*—Whitham & Marhoefer

[57] ABSTRACT

An electronic device has a rack accommodating a mother board and a first and a second printed circuit board (PCB) group mounted on the mother board. The PCBs belonging to one of the first and second groups are mounted on the mother board in an upper half of the rack while having the surfaces thereof positioned substantially parallel to the side walls of the rack. The PCBs belonging to the other group are mounted on the mother board in a lower half of the rack while having the surfaces thereof held substantially horizontal. If necessary, a third group of PCBs are positioned above one of the first and second PCB groups and mounted on the mother board with their surfaces held substantially horizontal. The wiring network between the first and second (and third) PCB groups is formed on the surface of the mother board by printing. Two electric fans may be respectively located between the first and second PCB groups and between the third and first (or second) PCB groups.

9 Claims, 6 Drawing Sheets

STRUCTURE OF AN ELECTRONIC DEVICE INCLUDING A NUMBER OF PRINTED CIRCUIT BOARDS

BACKGROUND OF THE INVENTION

The present invention relates to the structure of an electronic device including a number of printed circuit boards (PCBs) each being loaded with a number of LSIs or similar electronic parts. More particularly, the present invention is concerned with the structure of an electronic device having a layered switch circuit group e.g., a cross connect switch device constituting a node of an ATM (Asynchronous Transfer Mode) transmission network.

Generally, a cross connect switch device has a group of input switch circuits, a group of output switch circuits, and a wiring network connecting the two groups of switch circuits to each other. A group of intermediate switch circuits are interposed between the input and output switch circuit groups, depending on the required cross connecting function. In such a case, the above-mentioned wiring network is formed between the input switch circuit group and the intermediate switch circuit group and between the intermediate switch circuit group and the output switch circuit group. LSIs and other numerous electronic parts consisting of the input, intermediate and output switch circuit networks are mounted on a plurality of PCBs. The PCBs are, in turn, respectively inserted in a number of PCB connectors mounted on a single mother board. The wiring network is formed on the surface of the mother board and connected to the contacts of the PCB connectors.

The input and output switch circuit groups each has a number of unit switch circuits. Specifically, b unit switch circuits constituting the input switch circuit group each receives an input signal on any one of a input terminals and produces it on any one of c output terminals. Likewise, each of c unit switch circuits constituting the output switch circuit group receives the output signal of the input switch circuit group on any one of b input terminals and produces it on any one of d output terminals. The wiring network between the c×b output terminals of the b unit switch circuits of the input switch circuit network and the b×c input terminals of the unit switch circuits of the output switch circuit group are implemented by a number of unit wirings each connecting the n-th output terminal of the m-th unit switch of the former to the m-th input terminal of the n-th unit switch circuit of the latter. As a result, switch circuit networks having the wiring network therebetween are formed in a layered configuration.

Such a layered connection of switch circuit networks can be implemented as a simple bidimensional arrangement of the unit switch circuits and unit wirings. It follows that the layered connection is achievable if the input switch circuit group and the output switch circuit group are respectively formed on a first and a second PCB group, and then the PCB groups are mounted on a mother board on which a wiring network is printed beforehand.

In one of conventional structures of the above-described type of communication device, the mother board constitutes the back of a rack and, in this sense, it is often called a back wire board. The first and second PCB groups implementing the input and output switch circuit groups are respectively mounted on an upper half and a lower half of the mother board with the surfaces of the PCBs positioned parallel to the side walls of the rack. An electric fan is located between the two groups of PCBs for forcibly cooling them. Since the PCBs extend parallel to the side walls of the rack, i.e., parallel to the length of the mother board and, in addition, perpendicular to the surface of the mother board, the surfaces of the PCBs are free from deformation and, moreover, excessive stresses are prevented from acting on the portions of the PCBs which are connected to the mother board. In addition, the cooling effect available with the fan is enhanced since the PCBs are so oriented as to minimize the resistance to the flow of cooling air. However, since the PCB groups constituting the input and output switch circuit groups are oriented in the same direction on the mother board, the printed wiring provided on the mother board for forming the wiring network between the two switch circuit groups is complicated in configuration and, therefore, makes it difficult to realize the wiring network with a single layer printed wiring.

Another conventional structure is disclosed in U.S. Pat. No. 4,472,765. In this structure, two mother boards are arranged in a horizontal position in a rack. A first and a third PCB group are arranged one above another and in a horizontal position in a rack. The first and third PCB groups are respectively mounted on the upper mother board and the lower surface of the lower mother board and parallel to the side walls of the rack. A second PCB group is located between the two mother boards in parallel to the back of the rack. In such a structure, since the second PCB group is mounted on the mother boards in a position perpendicular to the first and third PCB groups, the configuration of the wirings on the mother boards is simple enough to implement the wiring network with a single layer printed wiring. However, this conventional scheme has a problem that it needs two mother boards and, in addition, makes it impossible for the operator to replace the PCBs at the front of the rack. The three PCB groups are each parallel to the side ealls or the back of the rack, i.e., perpendicular to the ground. Although such an arrangement is desirable from the cooling standpoint, the mother board intervening between the first and second PCB groups and the mother board intervening between the second and PCB groups not only reduce the cooling effect but also obstruct the arrangement of an electric fan for forced cooling.

It is therefore an object of the present invention to provide a structure of a cross connect switch or similar electronic device having a number of PCBs and a mother board on which the PCBs are mounted, which structure simplifies the configuration of a printed wiring on the mother board without degrading the cooling effect on electronic parts mounted on the PCBs or the ease of maintenance and repair at the front of a rack.

An electronic device of the present invention has a rack accommodating a mother board and a first and a second PCB group mounted on the mother board. One of the first and second PCB groups is mounted on the mother board in an upper half of the rack such that the surfaces of the individual PCBs extend substantially parallel to the side walls of the rack. The other PCB group is mounted on a lower half of the rack such that the surfaces of the individual PCBs extend substantially in the horizontal direction. A third PCB group may be disposed above one of the first and second PCB groups, if necessary. Then, the PCBs of the third PCB group are mounted on the mother board with their surfaces held substantially in the horizontal position. A wiring network between the first and second (and third) PCB groups is formed on the surface of the mother board by printing. Two fans may be respectively interposed between the first and second PCB groups and between the third and first (or second) PCB groups, as needed.

With the above construction, it is possible to simplify the configuration of the wiring network on the mother board without affecting the cooling effect on the electronic parts of the PCBs or degrading the ease of maintenance and repair at the front of the rack.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE INVENTION

Figure 1:
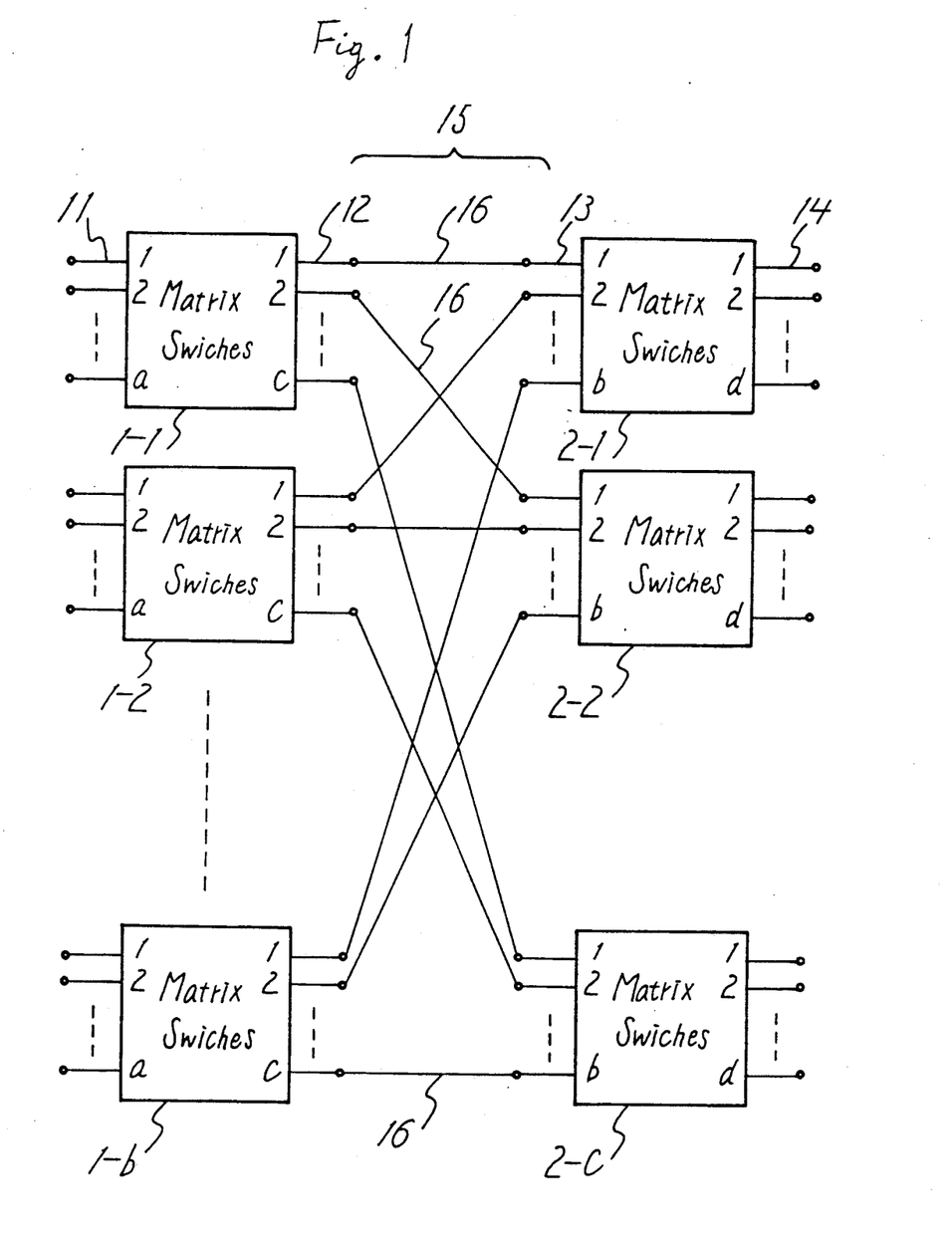
FIG. 1 is a block diagram schematically showing a general cross connect switch circuit.

Referring to FIG. 1 of the drawings, a general cross connect switch device has an input switch circuit group made up of b unit switch circuits 1-1 to 1-b, and an output switch circuit group made up of c unit switch circuits 2-1 to 2-c. The unit switch circuits 1-1 to 1-b each has a input terminals 11, c output terminals 12, and switch elements arranged in a matrix for selectively connecting one of the input terminals 11 to one of the output terminals 12. Likewise, the unit switch circuits 2-1 to 2-c each has b input terminals 13, d output terminals 14, and switch elements for selectively connecting one of the input terminals 13 to one of the output terminals 14. A wiring network 15 is arranged between the output terminals 12 of the unit switch circuits 1-1 to 1-b and the input terminals 13 of the unit switch circuits 2-1 to 2-c and constituted by a number of unit wirings 16. The unit wirings 16 connect the first to c-th output terminals 12 of the unit switch circuit 1-1 to, respectively, the first input terminals 13 of the unit switch circuits 2-1 to 2-c, connect the first to c-th output terminals 12 of the unit switch circuit 1-2 to, respectively, the second input terminals 13 of the unit switch circuits 2-1 to 2-c, and in the same manner connect the n-th output terminals 12 of the unit switch circuit 1-m (m being smaller than or equal to a) to the m-th input terminals 13 of the unit switch circuits 2-n (n being smaller than or equal to b). The wiring network 15 is capable of connecting any one of the input terminals 11 to any one of the output terminals 14.

Figure 2:
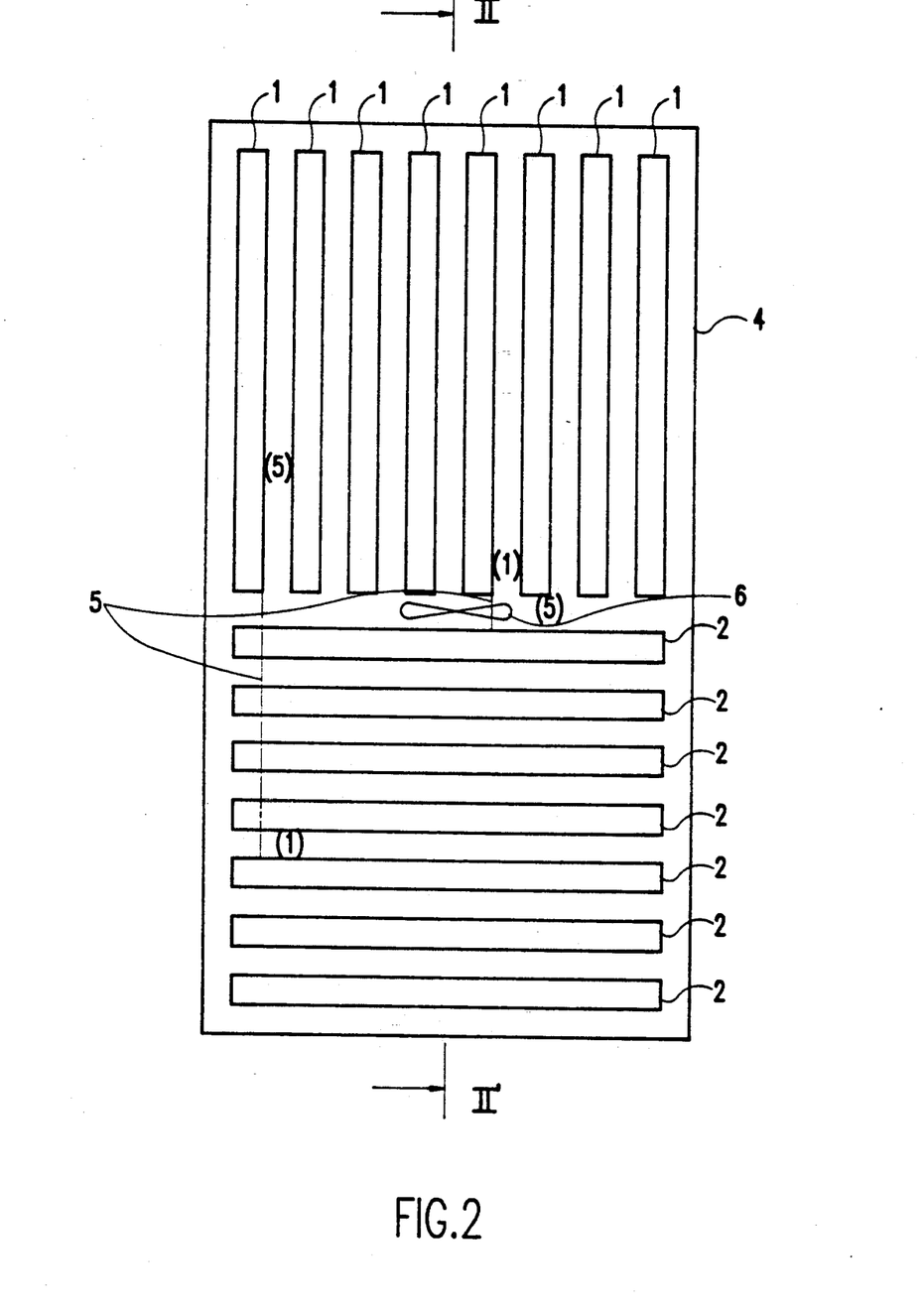
FIG. 2 is a front view schematically showing a structure of an electronic device embodying the present invention.
Figure 3:
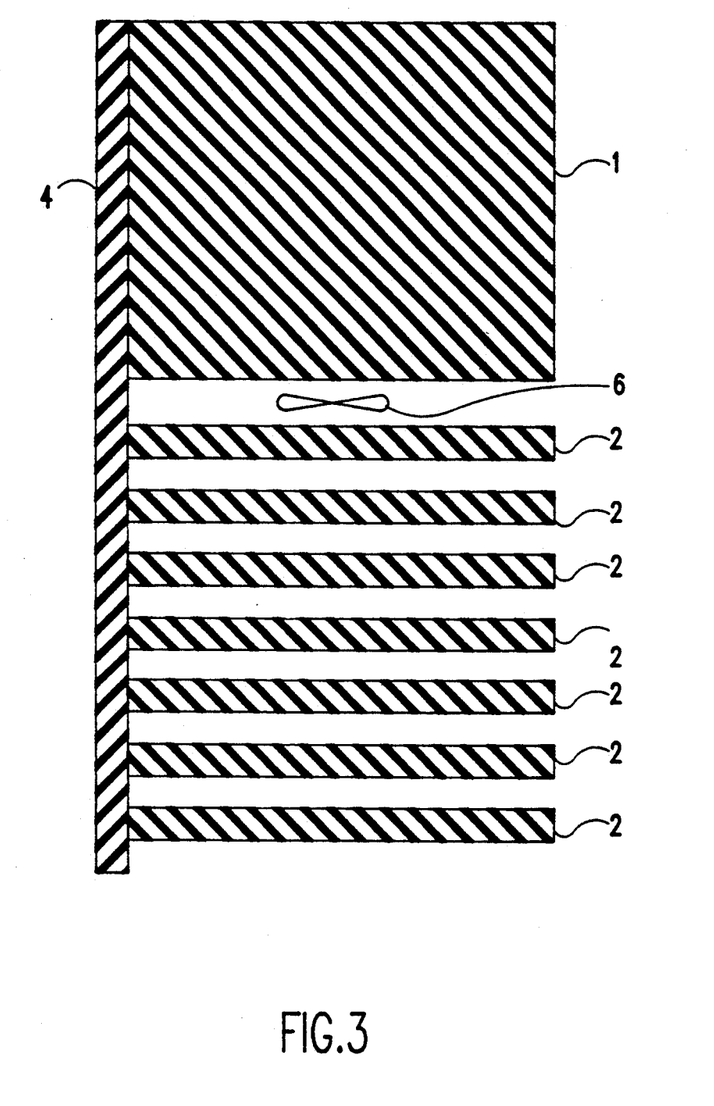
FIG. 3 is a section along line Y—Y' of FIG. 2.

FIGS. 2 and 3 show a cross connect switch device embodying the present invention. As shown, the cross connect switch device is made up of two groups of PCBs, i.e., a group of PCBs 1 constituting an input switch circuit group and a group of PCBs 2 constituting an output switch circuit group. The PCBs 1 are arranged parallel to the side walls of a rack, not shown, and perpendicular to the ground. The PCBs 2 are accommodated in a lower portion of the rack in a horizontal position. Each PCB of the PCB groups 1 and 2 has a rectangular configuration and includes a number of (e.g. one hundred or more) switching LSIs. A plurality of PCB connectors, not shown, are mounted on a mother board 4 which is affixed to the back of the rack. The plurality of PCBs 1 and 2 are each inserted in respective ones of the PCB connectors. The PCB connectors and wirings laid on the mother board 4 constitute the wiring network 15, FIG. 1, between PCBs 1 and 2. All the unit wirings 5 of the network 15, except for their end portions, extend in the vertical direction and do not intersect each other, as will be described.

In FIG. 2, there are shown the unit wiring 5 connecting the fifth terminal of the first PCB 1 included in the input switch circuit group and the first terminal of the fifth PCB 2 included in the output switch circuit group, and the unit wiring 5 connecting the first terminal of the fifth PCB 1 of the input switch circuit group and the fifth terminal of the first PCB 2 of the output switch circuit group.

Figure 4:
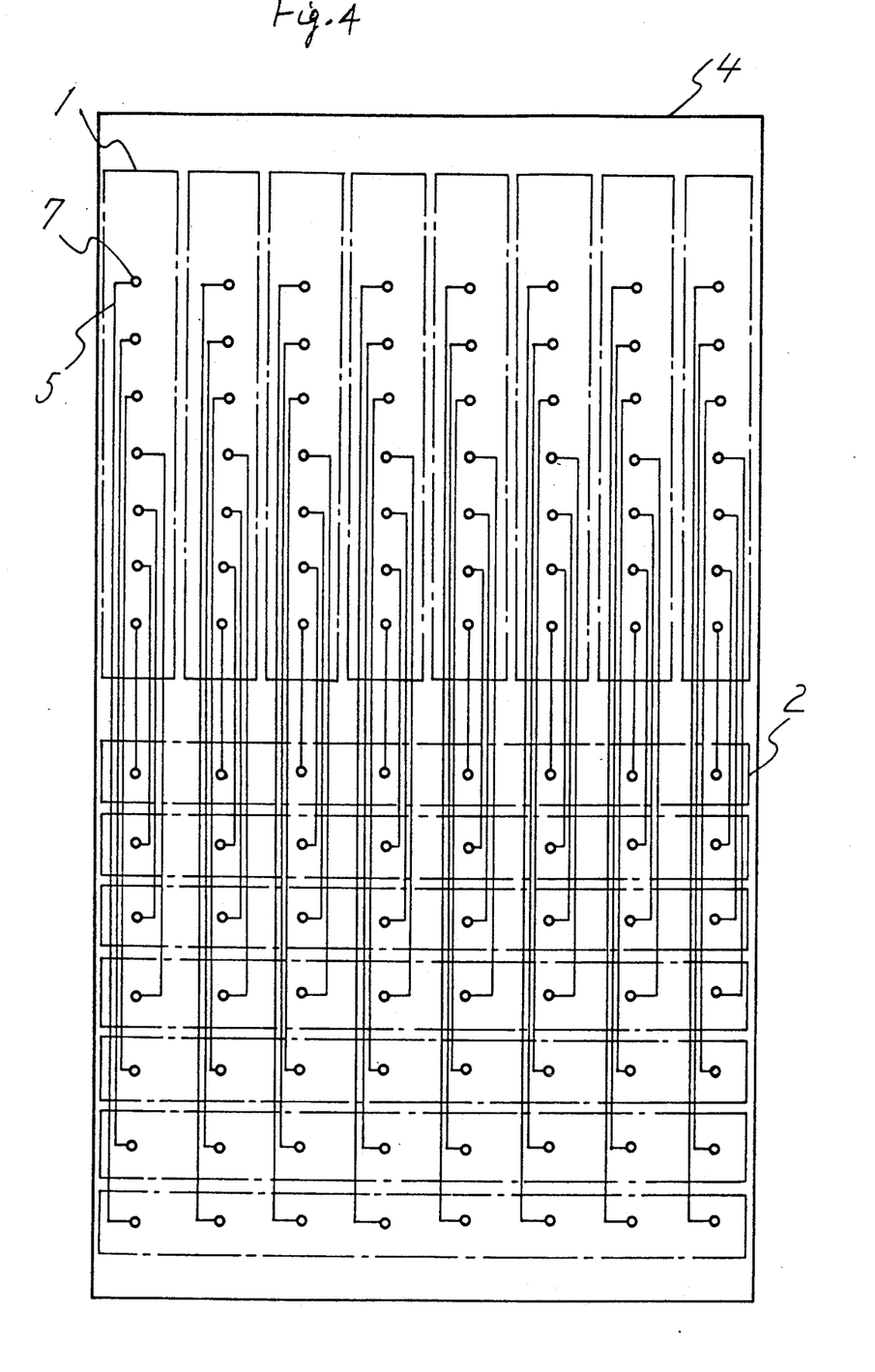
FIG. 4 is a front view of a wiring pattern of a wiring network formed on a mother board shown in FIG. 2 and intervening between an input and an output stage.

Referring to FIG. 4, the positional relation of the PCBs 1 and 2 mounted on the mother board 4 is indicated by dash-and-dot lines while the wiring pattern of the unit wirings 5 connecting the PCBs 1 and 2 is indicated by solid lines. The unit wirings 5 are each connected at both ends thereof to through holes 7 which set up connection with the terminals of the PCB connectors which receive the associated PCBs 1 and 2. Why the unit wirings 5 do not intersect is that the PCBs 1 of the input switch circuit network and the PCBs 2 of the output switch circuit network are positioned vertically and horizontally, respectively. Specifically, since all the PCBs 2 are so positioned as to traverse the vertical wirings extending from the terminals of the PCBs 1, the unit wirings 5 between the PCBs 1 and PCBs 2 do not have to intersect one another.

An electric fan 6 is interposed between the input stage and the output stage. The PCBs 2 located at the output stage and held in a horizontal position may slightly lower the cooling efficiency of the fan 6 and cause the PCBs 2 to deform. The decrease in the cooling efficiency of the fan 6 can be coped with if the amount of cooling air from the fan 6 is increased or if the PCBs 2 are slightly inclined from the horizontal position to define a convection path. The deformation of the PCBs 2 matters little since the total weight of electronic parts mounted on each PCB is light due to the recent improvement in the integration degree of LSIs. If the influence of the deformation of the PCBs 2 is not negligible, a thin elongate reinforcing member may be attached to the end portions of the individual PCBs 2.

If desired, the positional relation of the plurality of PCBs 1 and the plurality of PCBs 2 to the mother board 4 may be reversed. It will be apparent that even such an alternative arrangement is successful in achieving the above-stated operation and effect.

Figure 5:
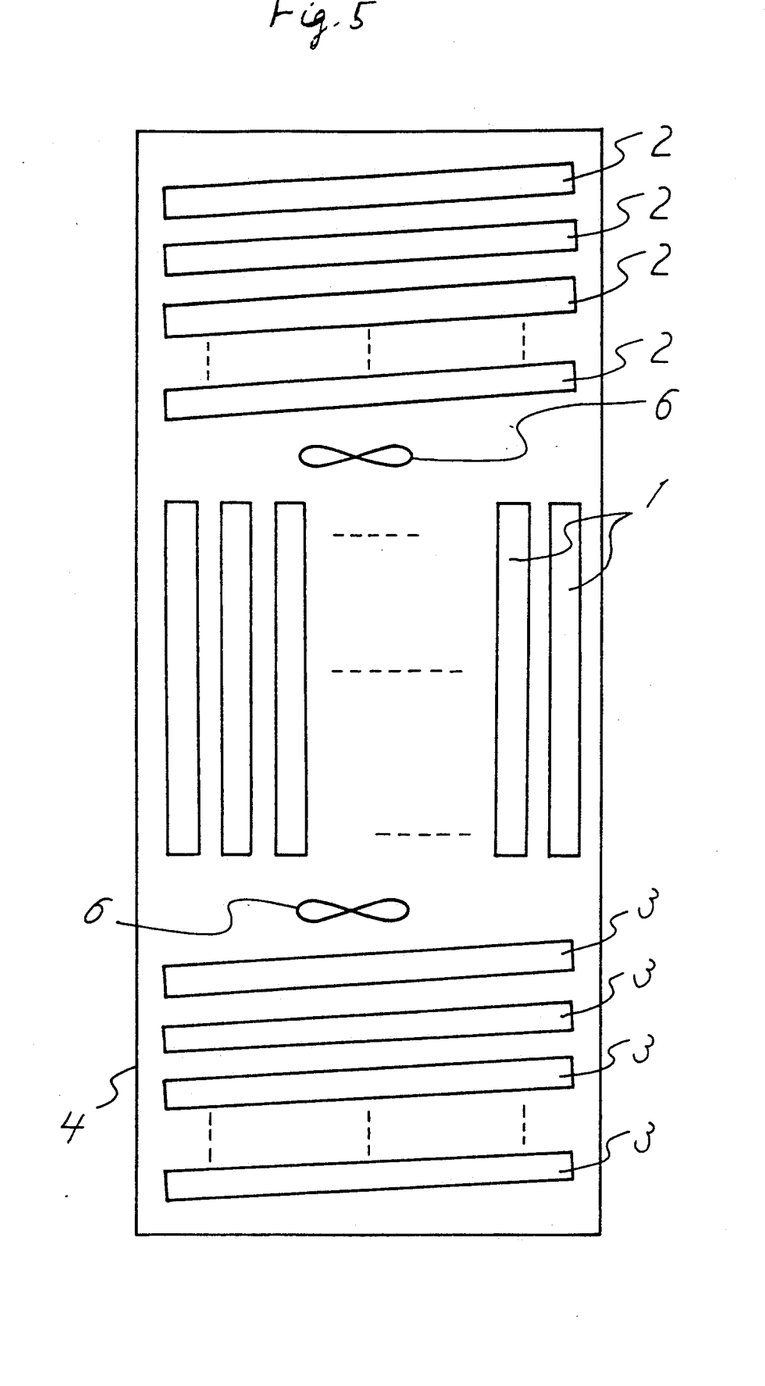
FIG. 5 is a front view schematically showing an alternative embodiment of the present invention.

FIG. 5 shows an alternative embodiment of the present invention. As shown, a first group of PCBs 1 is positioned in an intermediate portion of the mother board 4 with respect to the up-and-down direction while a second group of PCBs 2 and a third group of PCBs 3 are positioned in an upper portion and a lower portion, respectively. The PCBs 1 are each mounted on the mother board 4 in a substantially vertical position. The PCBs 2 and 3 are mounted on the mother board 4 in a substantially horizontal position. An electric fan 6 is disposed between the PCBs 1 and the PCBs 2, and another electric fan 6 is disposed between the PCBs 1 and the PCBs 3. The PCBs 2 and 3 are slightly inclined to facilitate the flow of cooling air. To further enhance the cooling effect, extra fans may be added to set up the flow of air along the surfaces of the horizontal PCBs 2 and 3.

Figure 6:
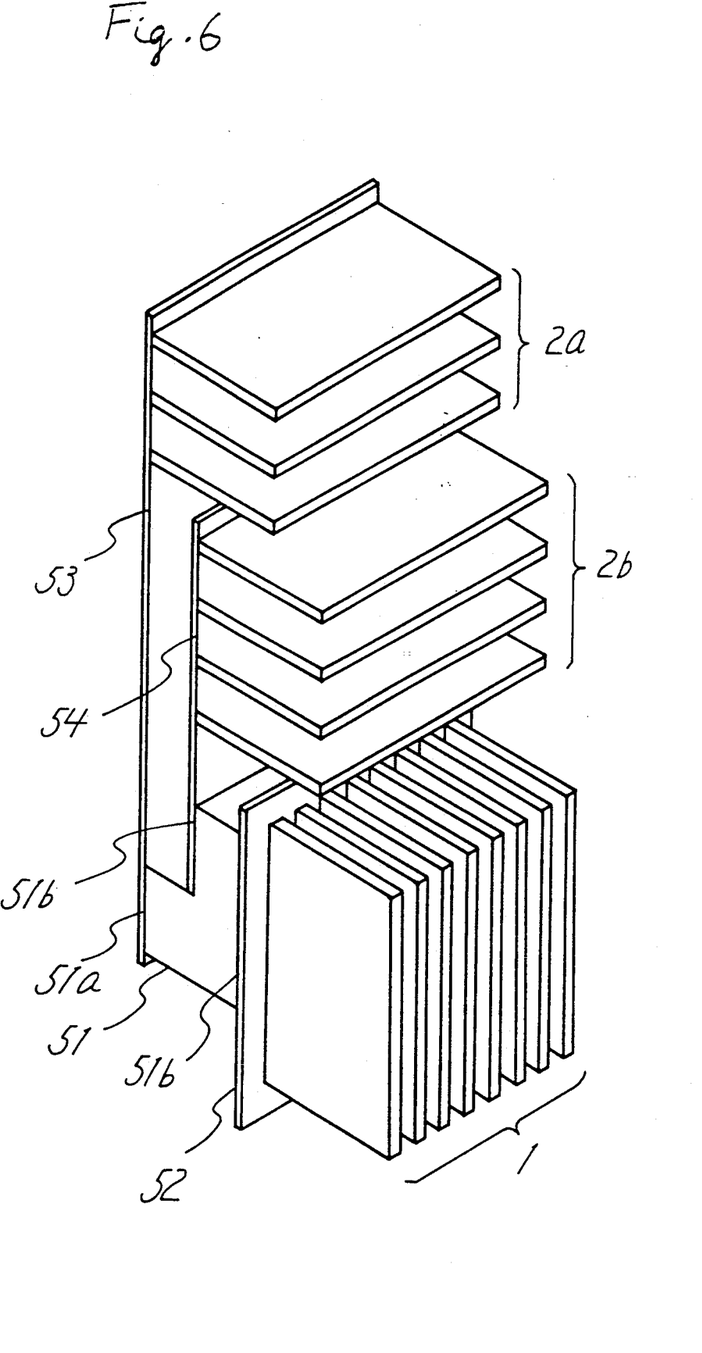
FIG. 6 is a perspective view showing another alternative embodiment of the present invention.

FIG. 6 shows another alternative embodiment of the present invention in a perspective view. As shown, a plurality of PCBs 1 of the input switch circuit network are mounted on a first mother board 52 in a vertical position. A plurality of PCBs 2a forming part of the output switch circuit network are mounted on a second mother board 53 in a horizontal position. Further, a plurality of PCBs 2b forming the other part of the output switch circuit network are mounted on a third mother board 54 in a horizontal position. Wirings, not shown, provided on the surfaces of the mother boards 52, 53 and 54 are connected by a step-like connector 51. Specifically, the connector 51 has connecting surfaces 51a and 51b located in spaced parallel planes, and a connecting surface 51c located at the opposite side to the surfaces 51a and 51b. The connector 51 is connected to the mother boards 53 and 54 at the connecting surfaces 51a and 51b, respectively, and to the mother board 52 at the connecting surface 51c. The terminals of the PCBs 1 are connected to the wirings provided on the mother boards 53 and 54 via the connector 51. The wiring network among the PCBs 1, 2a and 2b is implemented by the conductor of the connector 51 and the wiring patterns provided on the surfaces of the mother boards 53 and 54.

In the embodiment shown in FIG. 6, the terminals of the PCBs 1 are connected to the conductor of the connector 51 without the intermediary of the wiring pattern of the mother board 52, and the input terminals of the PCBs 2a and 2b are connected to the conductor of the connector 51 by the wirings of the mother boards 53 and 54. Therefore, it is not necessary to increase the density of the wiring pattern to be provided on the mother board which constitutes the wiring network between the input switch circuit network and the output switch circuit network. Stated another way, the mother board has a margin regarding the upper limit of the density of a wiring to be formed thereon.

While the embodiments have been shown and described in relation to a cross connect switch device, the present invention is, of course, applicable to any other electronic device having a layered circuit arrangement similar to that of a cross connect switch circuit.

Although the invention has been described with reference to specific embodiments, this description is not meant to be construed in a limiting sense. Various modifications of the disclosed embodiments, as well as other embodiments, will become apparent to persons skilled in the art upon reference to the description of the invention. It is therefore contemplated that the appended claims will cover any modifications or embodiments as fall within the true scope of the invention.

What is claimed is:

1. A structure of an electronic device, comprising:
    at least one mother board elongated in an up-and-down direction and provided with a wiring circuit network comprising printed wirings on a first surface thereof;
    a plurality of first printed circuit boards mounted on said at least one mother board at a first position in the up-and-down direction of said at least one mother board and having a plurality of surfaces positioned parallel to the up-and-down direction and substantially perpendicular to the first surface of said at least one mother board, said plurality of first printed circuit boards each carrying a number of electronic parts therewith and comprising a printed circuit electrically connecting said electronic parts, and connection terminals formed by ends of said printed circuit;
    a plurality of second printed circuit boards mounted on said at least one mother board at a second position in the up-and-down direction of said at least one mother board and having a plurality of surfaces positioned perpendicular to the up-and-down direction and substantially perpendicular to the first surface of said at least one mother board, said plurality of second printed circuit boards each carrying a number of electronic parts therewith and comprising a printed circuit for electrically connecting said electronic parts, and connecting terminals formed by ends of said printed circuit; and
    connector means for connecting said connecting terminals of said first printed circuit boards to said connecting terminals of said second printed circuit boards via said wiring circuit network provided on said at least one mother board, said connector means being connected to said first and second printed circuit boards to connect said first and second printed circuit boards to said at least one mother board, said connector means including unit wirings, said units wirings being positioned so as not to intersect one another;
    said wiring circuit network comprising a single layer printed circuit.

2. A structure as claimed in claim 1, wherein said at least one mother board comprises at lest two separate mother boards which are parallel to and electrically connected to each other, said first and second printed circuit boards being distributed to said at least two separate mother boards.

3. A structure as claimed in claim 2, wherein said at least two mother boards comprises three separate mother boards.

4. A structure as claimed in claim 1, wherein said first and second positions are respectively a lower portion and an upper portion of said at least one mother board.

5. A structure as claimed in claim 1, wherein said first and second positions are respectively an upper portion and a lower portion of said at least one mother board.

6. A structure as claimed in claim 1, further comprising an electric fan interposed between said first and second positions for feeding a stream of air for forced cooling to said first and second printed circuit boards.

7. A structure as claimed in claim 1, further comprising a plurality of third printed circuit boards having substantially the same structure as said first and second printed circuit boards and mounted on said at least one mother board at a third position in the up-and-down direction of said at least one mother board and having a plurality of surfaces positioned perpendicular to the up-and-down direction and substantially perpendicular to the first surface of said at least one mother board.

8. A structure as claimed in claim 7, wherein said at least one mother board comprises at least two separate mother boards which are parallel to and electrically connected to each other, said first, second and third printed circuit boards being distributed to said at least two separate mother boards.

9. A structure as claimed in claim 7, further comprising two electric fans respectively located between said first position and said second position and between said first position and said third position for feeding a stream of air for forced cooling to said first, second and third printed circuit boards.

* * * * *